(12) United States Patent
Jack et al.

(10) Patent No.: US 6,329,649 B1
(45) Date of Patent: Dec. 11, 2001

(54) MM-WAVE/IR MONOLITHICALLY INTEGRATED FOCAL PLANE ARRAY

(75) Inventors: Michael D. Jack, Goleta; Jan Grinberg, Los Angeles; Franklin A. Dolezal, Reseda, all of CA (US); Ray Balcerak, Alexandria, VA (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/414,988

(22) Filed: Oct. 7, 1999

Related U.S. Application Data (60) Provisional application No. 60/103,442, filed on Oct. 7, 1998.

(51) Int. Cl.[7] .............................. G01R 23/02; G01J 5/00
(52) U.S. Cl. .................. 250/250; 250/338.1; 250/338.4; 338/14; 338/18
(58) Field of Search ................................. 250/250, 338.1, 250/336.1, 338.4, 339.02, 334, 370.01, 264, 266, 267; 338/14, 18, 22 R, 22 SD, 23, 24; 343/700, 720, 721

(56) References Cited

U.S. PATENT DOCUMENTS 4,654,622 * 3/1987 Foss et al. .............................. 338/14

* cited by examiner

*Primary Examiner*—Hung Xuan Dang
(74) *Attorney, Agent, or Firm*—William C. Schubert; Glenn H. Lenzen, Jr.

(57) ABSTRACT

An integrated infrared and millimeter-wave monolithic focal plane sensor array having a substrate upon which an integrated array of infrared sensors and mm-wave sensors are provided at a first planar level on the same side of the substrate, and a planar antenna for receiving incident millimeter-wave radiation located at a second planar level located between the integrated array of sensors and the surface of the substrates for coupling the mm-wave radiation field to the mm-wave sensor. The antenna receiver of electromagnetic radiation, in one embodiment, is an antenna having a crossed bowtie configuration which efficiently couples the radiation field to the mm-wave sensor. The invention also is directed to a method of fabricating such a radiation sensor.

27 Claims, 5 Drawing Sheets

MM-WAVE/IR MONOLITHICALLY INTEGRATED FOCAL PLANE ARRAY

CROSS-REFERENCE TO RELATED APPLICATIONS

This application claims benefit of U.S. Provisional Application No. 60/103,442 filed Oct. 7, 1998.

BACKGROUND OF THE INVENTION

1. Field of the Invention

The present invention generally relates to the field of radiation sensors. More particularly, the present invention relates to a monolithic integrated focal plane sensor array having elements sensitive to millimeter-wave radiation and elements sensitive to infrared radiation.

2. Description of the Related Art

Radiation sensors are generally known which convert electromagnetic radiation for radiation sensing equipment that is capable of detecting and monitoring electromagnetic radiation of varied wavelength bands to provide a multimode sensing type of device. In the prior art, physically separate, non-integrated millimeter-wave (mm-wave or MMW) and infrared (IR) sensing units have been used to provide separate sensing and detecting capabilities in those two different electromagnetic wavelength bands, which, however, leads to a bulky overall system. Several prior attempts have been made to fabricate a single integrated system incorporating two separate FPAs (focal plane arrays), with one being a mm-wave FPA and the other an IR FPA, as provided on a common support body or substrate. However, millimeter-wave radiation of approximately 94 GHz and IR at 3–5 and 8–12 $\mu$m (where atmospheric transmission of IR is greatest) differ so significantly in frequencies from each other that integrating these different types of electromagnetic radiation sensors into a single device has posed a technical and practical challenge in the field. Sometimes these integrated systems have used a single aperture for receiving incident radiation at the sensor. The systems separate the incoming radiation energy into mm-wave and IR beams by means of a series of beam splitters to direct the appropriate energy to the appropriate FPA. However, such an approach results in increased cost, lower efficiency and increased size of the overall system.

U.S. Pat. Nos. 4,654,622 and 5,450,053 describe incorporating antennas in microbolometer detector architectures used for IR/mm-wave detection to provide a mm-wave energy coupling apparatus. These patents describe, as one embodiment, a linear sensor array on the front surface of a substrate that combines planar dipole or bowtie type antennas to couple the mm-wave radiation microsensors with interdispersed separate microsensors used for IR sensing. The mm-wave sensors sense only one polarization. The configuration of this linear geometry type of focal plane sensor array in these patents can not be extended to a two-dimensional (2-D) array. Also, the focal plane sensor array can not sense the other dimensional (2-D) array. Also, the focal plane sensor array can not sense the other polarization without losing ≈10× of IR resolution. In another described embodiment in these patents, fabrication of a two-dimensional array is proposed where "bow-tie" microantenna designs are formed on the backside of a silicon substrate while IR sensitive microdetector arrays are formed on the opposite frontside of the substrate, such that incident radiation is collected by the antennas after passing through the substrate. Again, the single "bowtie" microantennas sense only one polarization. This two-dimensional sensor array approach of the above-identified patents is considered problematic because, among other things, incident mm-wave radiation would be reflected by the intervening XY matrix read-out wiring associated with the IR sensor array before it reaches the antennas located on the backside of the substrate.

Consequently, there remains a need for improved monolithic sensors that integrate an IR sensor array with mm-wave sensors on a common support in way that can be conveniently fabricated while resulting in a high performance radiation sensing device.

SUMMARY OF THE INVENTION

The above and other needs in the art are addressed by the monolithic integrated radiation sensor of the present invention. In one embodiment of this invention, there is an integrated infrared and millimeter-wave monolithic focal plane sensor array comprising a substrate having first and second opposing generally flat surfaces in which an array of infrared sensors and at least one millimeter-wave sensor are provided at a first level on the first surface, and further including a planar antenna for receiving incident millimeter-wave the substrate, for coupling the millimeter-wave radiation field to the millimeter-wave sensor.

In one preferred implementation, this invention combines linear or two-dimensional (2-D) arrays of IR sensors and mm-wave sensors on the front surface of a silicon read-out IC (ROIC) substrate. Advantageously, the inventive focal plane sensor array incorporates an antenna onto the same side of the substrate as the mm-wave and IR microsensors having a unique and improved antenna shape for coupling a radiation field to the mm-wave sensor element. Namely, the improved antenna shape of the antenna is defined by two constituent microantennas which are orthogonally-oriented to one another in a manner, such as a "crossed-bowtie" configuration, enabling absorption of electromagnetic radiation of both polarities.

Among other advantages provided by the invention, the monolithically integrated mm-wave/IR focal plane sensor array is a bona fide integrated structure as both types of sensors are fabricated upon the same side of the substrate without the mm-wave sensor system interfering with the operation of the IR sensor system, and vice versa. Successfully combining these two types of sensors on one focal plane results in much smaller and lower cost system. It automatically provides the same, naturally aligned Field of View (FOV) for both imaging domains. This simplifies significantly the sensor fusion algorithms, which results in reduced needs for high speed, high power computing. Also, the inventive integrated sensor offers manufacturing ease as it only requires adding simple processing to provide the additional metallization layer for the antenna. Additionally, to make room for the mm-wave sensor on the same plane or level of the sensor device as the IR sensors, relatively little real estate is needed, e.g., only one out of about 100 IR bolometers must be sacrificed to make room for the mm-wave sensor. The performance of each respective mm-wave and/or IR sensor array can be maximized in an independent manner. The invention also is directed to a method of fabricating such a focal plane sensor array. also is directed to a method of fabricating such a focal plane sensor array.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Generally, the invention is directed to a monolithically integrated Focal Plane Array (FPA), or as referred to herein interchangeably as a "focal plane sensor array", that is sensitive both to mm-wave (MMW) and infrared (IR) radiations. The FPA array structure is a monolithic structure in which an antenna is added and one pixel out of an array of approximately 100 IR pixels is modified to sense the mm-wave on the same (front) side of the substrate. The fabrication of the chip is straightforward as the addition of the antenna merely adds a metallization step to the processing and the mm-wave sensor is produced in a very similar fashion to the IR sensors.

The Structure

Figure 1A:
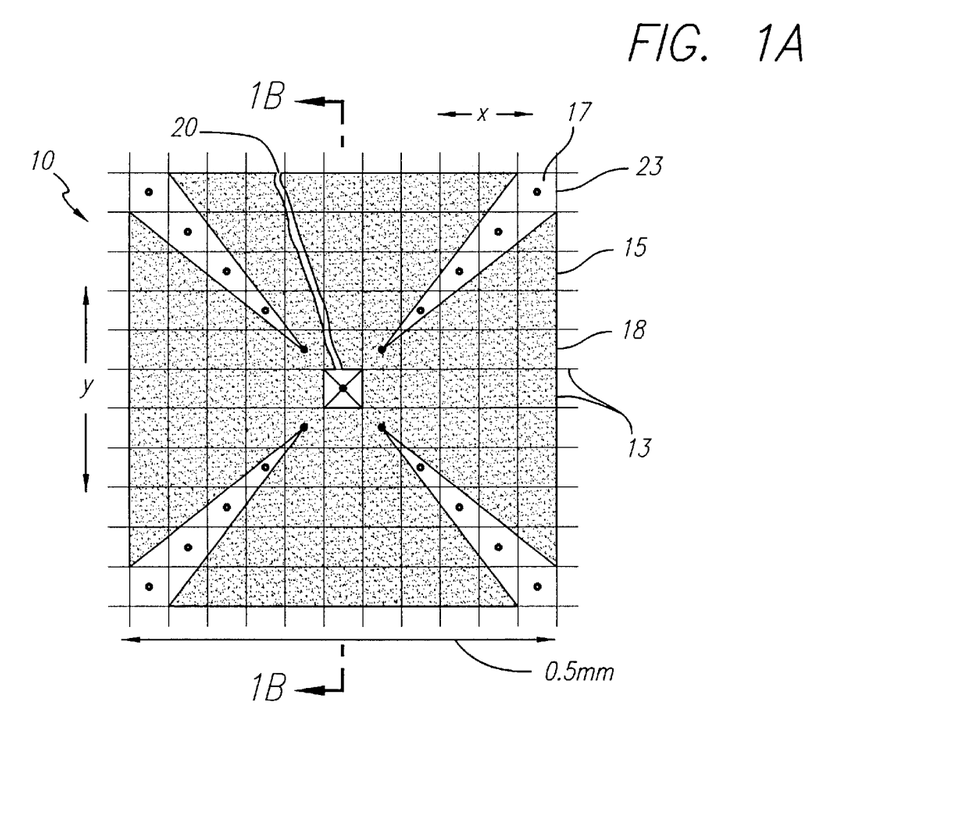
FIG. 1A is a cut-away view of a portion of the integrated focal plane sensor array of the invention using two orthogonally-oriented constituent microantennas as the receiver of incident MMW electromagnetic radiation taken from direction 1A—1A indicated in FIG. 1B.

Referring to FIG. 1A, an illustration of one mm-wave cell and 120 IR cells of a 0.5 mm$^2$ section 10 of an MMW/IR FPA array of this invention is shown. As will be understood, this representative section can be replicated in either lateral (horizontal, x-y) direction to create a linear array or in both x-y directions to create a two-dimensional array of the desired size, depending on the application envisaged. The mm-wave bolometer 20 is located between IR sensors 17 in both the x and y transverse directions. The mm-wave detector 20 (shown in more detail in FIG. 1C) and the IR detectors 17 (shown in more detail in FIG. 1D) are illustrated here as bolometers, but are not necessarily limited thereto. Other types of detectors could be used in lieu of bolometers, such as pyroelectric detectors.

A crossed bowtie antenna configuration 15 is shown which serves as a bidirectional polarization antenna. The mm-wave antenna 15 concentrates the mm-wave received signals onto mm-wave sensors 20, which are approximately the same size as the IR sensors 17. Generally, the mm-wave cell 20 is larger in linear dimensions than the size of the IR cell 22 size, and preferably can be 10 to 50 times larger. The performance of the inventive focal planar sensor array 10 is enhanced because the crossed bowtie shaped antenna 15 used with the mm-wave sensor element is better suited for detecting natural passive radiation, which is randomly polarized, i.e., has equal components in both polarization directions. Other symmetrical criss-crossed antenna shapes besides the crossed bowties, such as a logarithmic-curved side profile and so forth, are also contemplated for practice of this invention that provide the coupling function described herein. For at least a plurality of, if not substantially all, the mm-wave sensors 20 where a two-dimensional array of sensors is involved, each mm-wave sensor 20 has its own individual antenna 15 dedicated to support it.

Figure 1B:
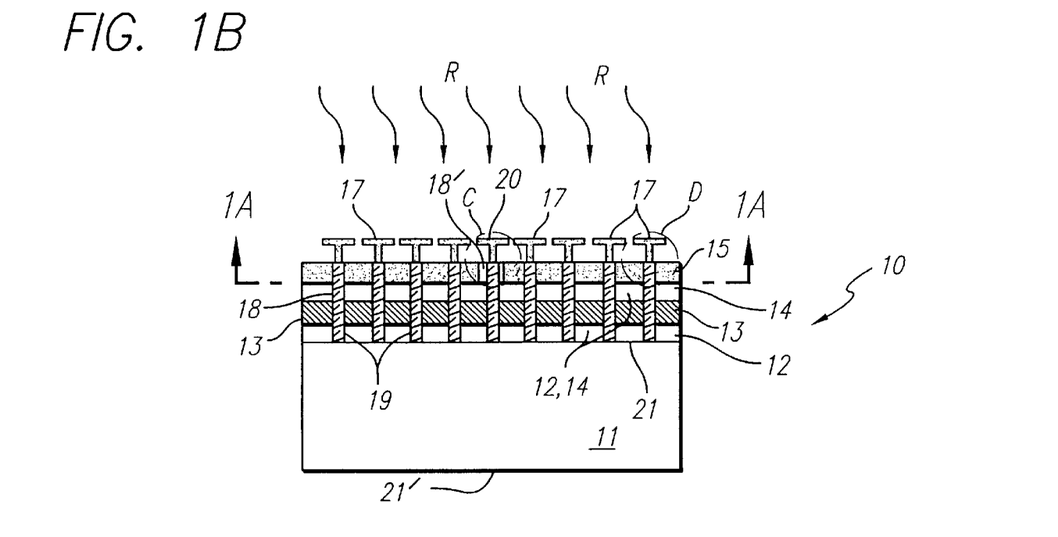
FIG. 1B is a partial cross-sectional side view of the monolithic integrated focal plane sensor array of FIG. 1A taken along direction 1B—1B indicated in FIG. 1A.

Referring to FIG. 1B, this combination of two-dimensional (2-D) arrays of IR and mm-wave sensors on the front surface 21 of a substrate 11, and opposite its back side 21', permits the performance of each sensor array to be independently maximized for each respective frequency to be detected or monitored. The IR sensor array 17 and the mm-wave sensor 20 are configured in a way that they do not interfere with one another. Namely, as seen in FIG. 1B, the arrays of the IR sensors 17, such as the uncooled bolometers or the pyroelectric membrane sensors, are suspended above the surface of an ROIC substrate 11 in a common horizontal plane. Below, on the surface of the ROIC substrate 11, an array of mm-wave antennas 15 is fabricated (only one is shown in FIG. 1B to simplify the illustration). Vertical contacts 19 are provided between the sensors 17 and 20, and the ROIC substrate 11. In order to accommodate the mm-wave sensor 20 on the same plane (level) as the IR sensors 17, only the space otherwise occupied by one or a few out of about 100 IR bolometer in a large array of IR sensors 17 (e.g., >100) must be sacrificed to make room for the mm-wave sensor 20.

The General Operation

Referring again to FIG. 1B, in the operation of section 10 of the MMW/IR FPA array, the incoming electromagnetic radiation beam R includes mm-wave and/or IR energy. For purposes of this discussion, it contains radiation of both bands. The combined beam first reaches the sensors 17, 20, and the IR portion of the beam R is absorbed in the IR sensors 17 where it can be processed in a conventional manner by a read-out circuit and signal processing circuitry provided with the substrate assembly 11. The mm-wave energy, by contrast, passes the IR sensors 17 undisturbed. Individually, the IR sensors do not absorb because they are small relative to the mm-wave wavelength. Collectively, the IR sensors 17 do not absorb mm-wave energy because the sheet conductivity of the sensor array is very low, and also the absorbing layer thickness is very small relative to the wavelength. The mm-wave beam is intercepted by the antenna 15 and absorbed in the central sensor 20, which carries the matching impedance of the antenna 15. This represents the mm-wave sensor element of the invention.

The read-out structure 11 used can be a conventional Read-Out IC (ROIC) design. The contacts 19 to the sensors 17 extend through vias 18 formed through the antenna 15, which are large enough to prevent contact of the antenna metallization with the contact metal, and small vias formed in the insulating layers 12, 14. The vias 18 are small in diameter relative to the mm-wave wavelength, and therefore the performance of the antenna 15 is not disturbed by their presence. The operation of this sensor array structure 10 is totally separated in the mm-wave and the IR regimes, even though the two sensor arrays 17, 20 are fabricated upon a common side 21 of a common substrate 11. As brought out earlier, the sensor array section 10 shown in FIG. 1B typically will be replicated in at least one transverse direction to form a linear or two-dimensional array as desired for the application.

The Device Fabrication

Figure 2A:
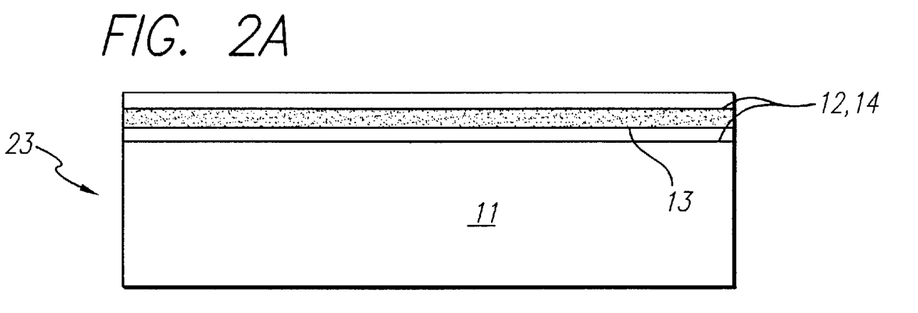
FIGS. 2A–2F show a basic fabrication scheme for making the integrated focal plane sensor array of the invention which is monolithically fabricated on the same side of a substrate.

A general fabrication scheme for making the inventive monolithic integrated sensor is shown in FIGS. 2A–2F. As shown in FIG. 2A, a semiconductor Read-Out IC chip 23 is provided including a substrate 11, typically a monocrystalline silicon wafer body fabricated with the read-out circuitry and bearing an X-Y IR read-out circuitry matrix (metallization) layer 13 interposed between two insulating layers 12, 14 (e.g., $SiO_2$, $Si_3N_4$) on a major surface of the substrate 11. The substrate 11 also can be silicon-on-insulator (SOI) structure. Thus, the substrate 11 can be a semiconductor water per se or a body that serves as a substrate assembly. In any event, the substrate 11 needs to have generally flat, opposing major surfaces. The Read-Out IC substrate 11 can be a conventional ROIC chip construction used to support FPAs.

Figure 2B:
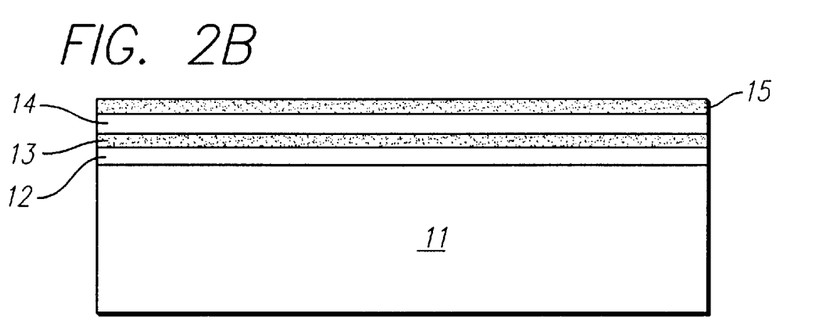

As shown in FIG. 2B, the substrate 11 is coated with a metallization layer 15 into which the antenna pattern (shown in FIG. 1A) is defined by standard photolithographic techniques. The antenna pattern that is formed as an aspect of this invention is not a standard photolithographic technique in the radiation sensor field. The antenna 15 is a generally planar thin film of conductive material (eg., a conductive metal such as aluminum) formed on the thin insulating film 14 (e.g., $SiO_2$, $Si_3N_4$). As shown in previously discussed FIG. 1A, the antenna is patterned as a crossed bowtie having a gap formed in the geometric center of the configuration. Where the antenna 15 is deployed in a manner to capacitively couple the mm-wave radiation field to the MM-wave sensor 20, the inner ends of the arms of the bowties constituting antenna 15 will be dimensioned in manner described in greater detail infra so as to partly underlap the mm-wave sensor 20.

Figure 2C:
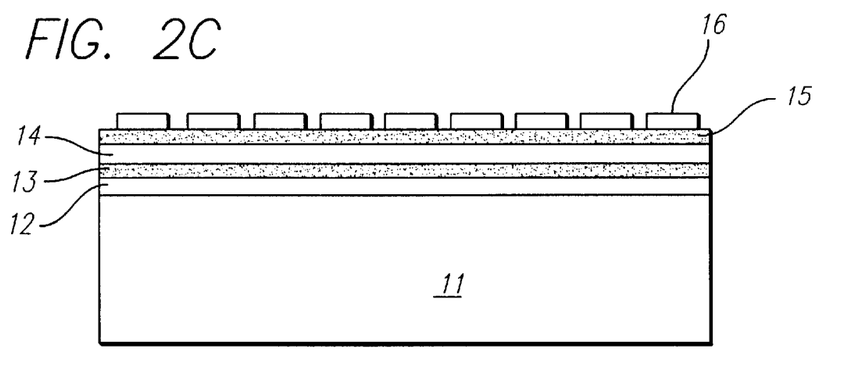

After defining the antenna in the metallization layer 15, a photoresist 16 is spun and patterned as shown in FIG. 2C. The photoresist 16 will be used as a sacrificial layer in the subsequent processing steps, as described below. Alternatively, the sacrificial layer could be polyimide or another selectively removable temporary support material.

Figure 2D:
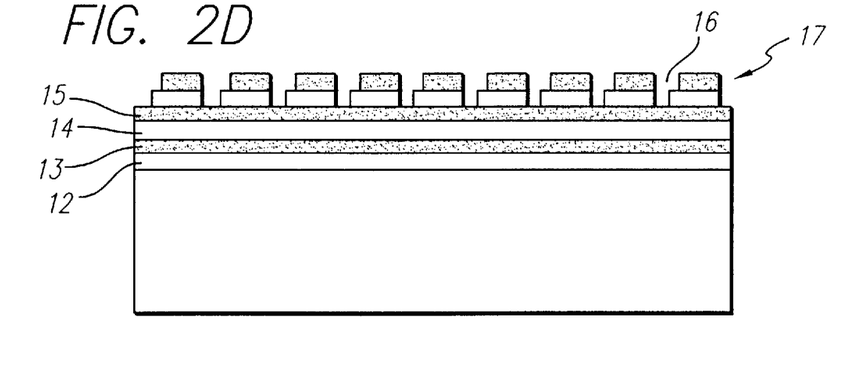

As shown in FIG. 2D, then sensors 17 are fabricated on the photoresist 16, which involves several steps of masking and deposition of appropriate sensing material such as thin film thermosensitive material. Typically, the mm-wave sensor is fabricated slightly differently than the IR sensors, but this ultimately depends on the type of sensor.

Figure 1C:
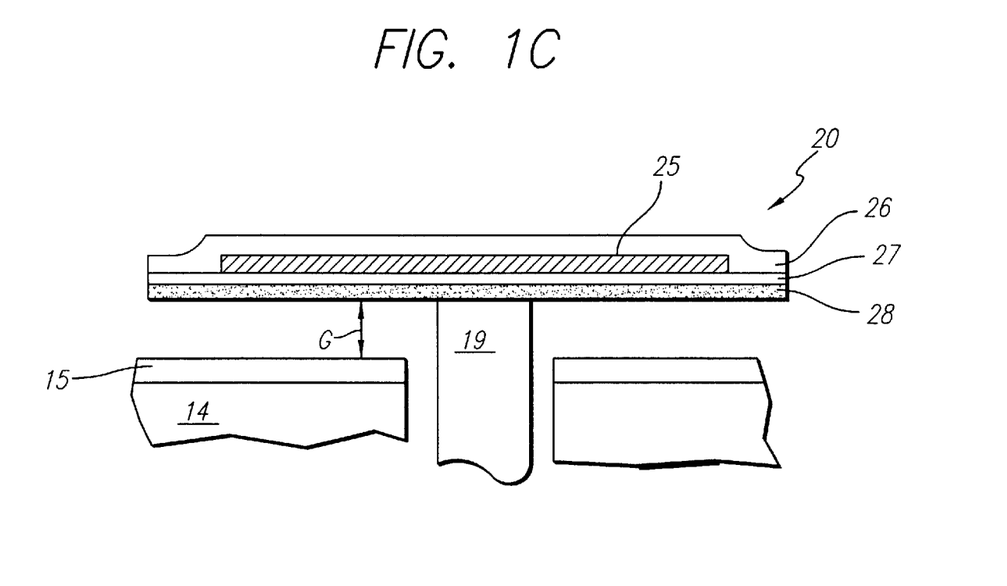
FIG. 1C is an enlarged view of the MMW sensor identified by circle C in FIG. 1B.
Figure 1D:
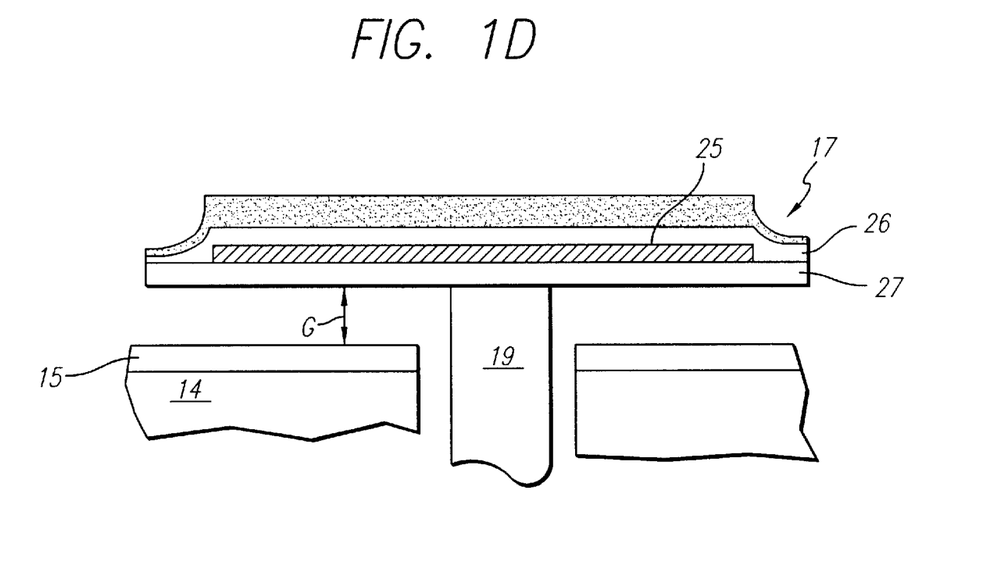
FIG. 1D is an enlarged view of the IR sensor identified by circle D in FIG. 1B.

As shown in FIGS. 1C and 1D, the fabrication of sensors 17 and sensor 20 basically involves a thin film thermally responsive resistive layer 25 (e.g., $VO_x$ where $x \leq 2$, $V_2O_y$, where y is an integer in the range 2–5, $TiO_x$, and so forth) sandwiched between dielectric thin films 26 and 27 (e.g., $Si_3N_4$, $SiO_2$, $SiO_xN_y$). To form the thin film of thermosensitive material 25, vanadium oxide can be deposited in thin film thicknesses, such as less than approximately 2000 angstroms, by various conventional deposition methods such as reactive sputtering, ion beam sputtering, and oxidation of a V film deposited via evaporation.

Additionally, a heater metal film 28, which preferably is a NiCr (Nichrome) layer, is formed as the bottom or the top or as both surface layers of mm-wave sensor 20 (see FIG. 1C). An optional IR absorber film can be coated upon the upper insulating/passivation film 26 formed on the thermoresistive film layer for purposes of the fabrication of the IR sensors 17 (see FIG. 1D). Also, the mass of the thin film resistive element 25 should be kept relatively low in order to provide fast response time, so this consideration supports a thin film construction.

Figure 2E:
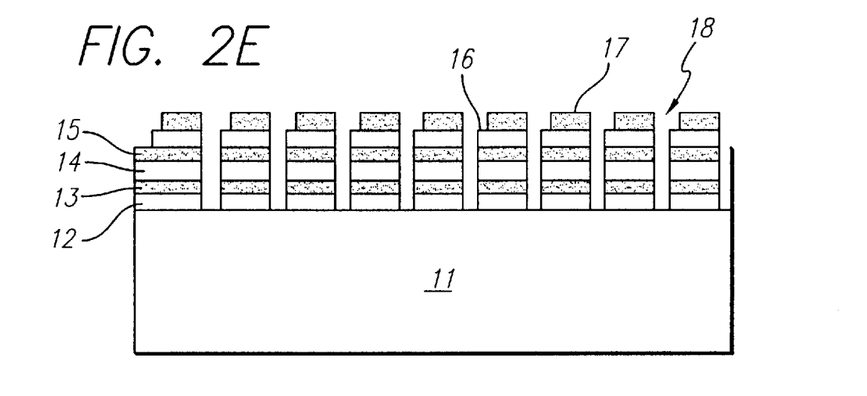

Next, as shown in FIG. 2E, vertical vias 18 are etched through the sandwich of insulating layers 12, 14, and metallization layers 13, 15 until they reach substrate 11. Photolithographic masking techniques can be used to define the locations of the vias 18. As can be seen in FIG. 1B, the diameter of the via 18' formed through central part of the antenna metallization layer 15 in this process step is larger than the diameter of the other vias 18 formed elsewhere in metal layer 25 and in the underlying insulating layer 14.

Figure 2F:
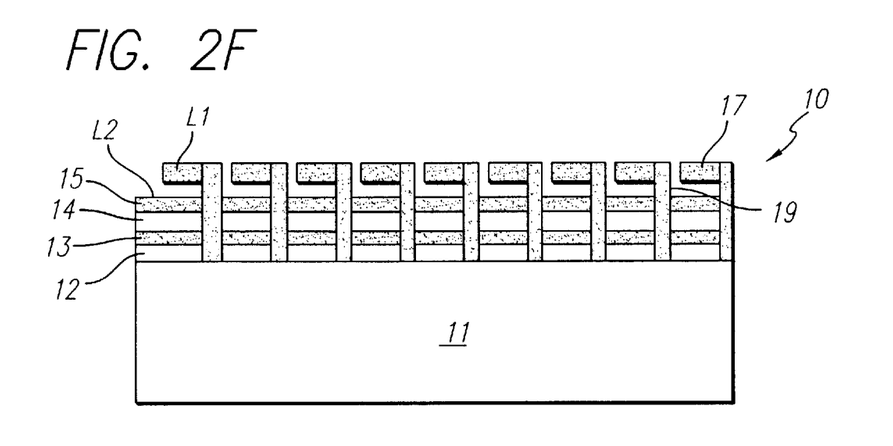

As shown in FIG. 2F, the contacts 19 are formed by filling vias 18 with conductive material by conventional methods. One or more conductive contact legs 19 are made to contact the thermoresistive film 25 and continuing along the side surfaces of the sacrificial layer 16 such that the legs 19 extend downward from and connect the sandwich structures of the sensors 17, 20 to the read out IC (ROIC) on the substrate 11. The contacts legs 19 preferably contain a mixture of dielectric nitride (e.g., $Si_3N_4$) with a metal, e.g., Ni—Cr, for stiffening and reducing thermal conductivity of the electrical contact legs. The leadout contact legs 19 effectively suspend the sensors 17, 20 in the form of a same plane microbridge structure located above and spaced from the surface of the antenna 15 at a second lower planar level. The contact legs 19 connect the thin film thermoresistive layer in the sensors to a low-noise electronic readout circuit (not shown) located on or off the substrate 11, which can be of a conventional type used for this purpose, monitoring the resistance of the thin film thermoresistive layer 25 of the sensors 17, 20 to provide electrical output signals to signal processing circuitry (not shown), which also can be of a conventional type used for this purpose.

Then, the sacrificial layer 16 is selectively removed while leaving the rest of the sensor architecture intact. In this way, the sensors 17 and 20 are physically spaced from and thermally isolated from the rest of the support structure other than the interconnecting leadout contacts 19 in the sense that there is no direct contact made by the sensors 17, 20 with the substrate 11 or its surface layers 12–15. In this way, the IR sensors 17 and mm-wave sensor 20 are located at a common planar level L1 spaced from the lower planar level L2 in which the antenna 15 extends. The sacrificial layer 16 can be removed by selective etching. Care must be taken to ensure that the insulating layer 14 located between the antenna defined in metallization layer 15 and the read-out matrix wires 13 is thick enough, so that the capacitive coupling of these elements is small. Similarly, the read-out matrix metallization 13 must be kept thin enough so that their impedance at the mm-wave frequency is high compared to the antenna impedance.

Alternatively, it is possible to fabricate the sensor array 10 shown in FIG. 1B with identical sensor structures throughout. In that scenario, all the sensors have both the heater metal resistive layer 28 shown in FIG. 1C and the absorptive layer as shown in FIG. 1D. The MMW radiation couples to the sensor 20 because this is the only sensor located above the bowtie antenna gap. However, for this alternative, to prevent absorption of the IR radiation in the mm-wave sensor 20, a small metal patch (not shown) is evaporated on the front window (not shown) above the sensor 20. By making the sensors in each array the same way according to this alternative embodiment, the fabrication process is further simplified.

The Antenna Construction and Operation

Figure 1E:
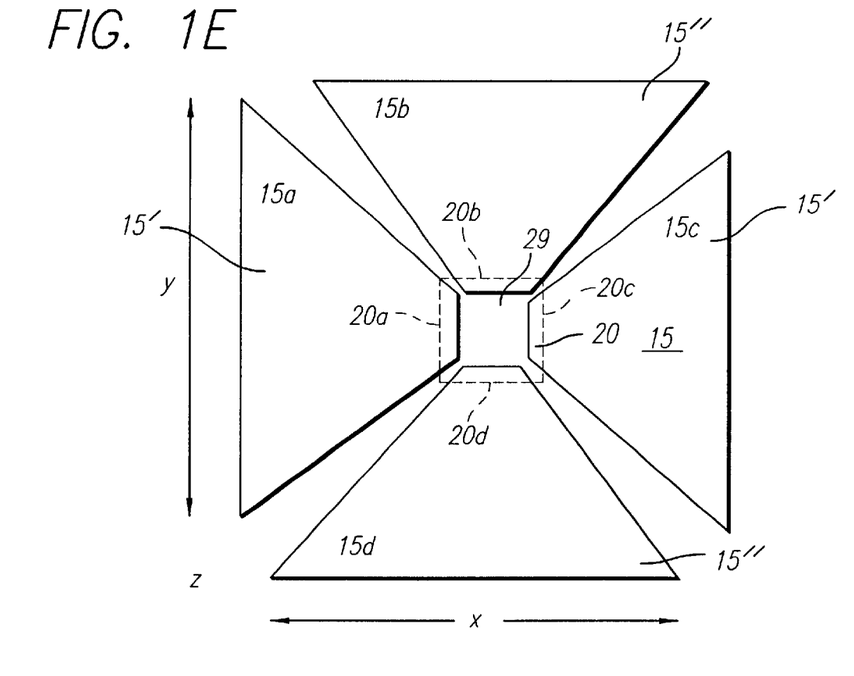
FIG. 1E is an isolated schematic representation of the antenna and mm-wave sensor element components of the integrated focal plane sensor array taken from direction 1A—1A indicated in FIG. 1B.

Referring now to FIG. 1E, a top view of an antenna 15 and mm-wave sensor 20 as a capacitively coupled radiation sensor 20 is illustrated. The electromagnetic energy intercepted by each antenna 15 may be capacitively, resistively or inductively coupled to sensor 20, which is a thermal detector element in this illustration. In the case of capacitive coupling, and which is exemplified in more detail below, the energy captured by the antenna 15 is capacitively coupled from the portion of the antenna underlapping the related sensor 20 through a precisely controlled gap to a dissipative heater metal layer constituent of the sensor 20. In general, the resistance of the heater metal layer and the capacitance from the antenna underlap are selected so that: (i) the total impedance of the series capacitance-resistance-capacitance is matched to the antenna impedance for efficient coupling; and (ii) the capacitive impedance is preferably smaller than the dissipative metal impedance in the bolometer.

In FIG. 1E, the overall configuration of antenna 15 is a modified crossed bowtie shape in which the location of the superposed mm-wave sensor element 20, indicated by the dotted lines, and bounded by its peripheral side edges 20a, 20b, 20c, and 2d, is superposed for reference sake. The crossed bowtie shape of the antenna 15 is modified in the sense that the two constituent bowtie microantennas 15' and 15" are oriented orthogonally with each other with the proviso that the two bowties do not physically meet at their geometric centers. Moreover, the microantennas 15' and 15" do not physically contact each other at any location.

Figure 1F:
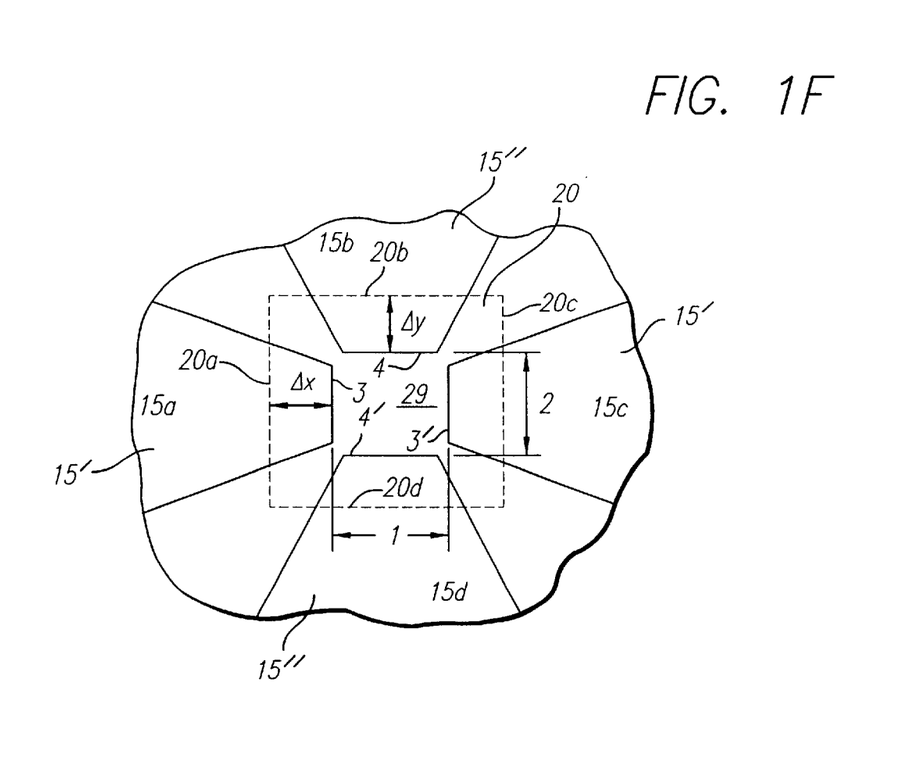
FIG. 1F is an enlarged isolated top view of the central area of the antenna and mm-wave sensor element components of the integrated focal plane sensor array shown in FIG. 1E.

As can be better seen in FIG. 1F, a lateral (horizontal) gap distance 1 is provided between the inner ends 3 and 3' of conductive arms 15a and 15c, respectively, of bowtie 15'. Similarly, a lateral (horizontal) gap distance 2 is provided between the inner ends 4 and 4' of conductive arms 15b and 15d, respectively, of bowtie 15". None of the conductive arms 15a, 15b, 15c and 15d physically contact each other as that would lead to shorting of the gap. Conductive arms 15a and 15c of first bowtie microantenna 15' each partly underlap the overlying side edges 20a and 20c, respectively, of overlying mm-wave sensor 20. This underlap is a distance Δx at each of the inner ends 3 and 3' of the arms 15a and 15c of that bowtie 15'. The lateral separation gap distance 1 in the x-direction is also provided between the two arms 15a and 15c beneath the heater metal layer 28 of the sensor 20. The conductive arms 15b and 15d of the second bowtie microantenna 15" constituent of antenna 15, and oriented orthogonally to the first bowtie 15', underlap side edges 20b and 20d, respectively, of sensor 20. The underlaps of sensor 20 by conductive arms 15b and 15d of microantenna 15" are each a distance Δy at the inner ends 4 and 4', respectively, of each arm of that second bowtie. The lateral separation gap distance 2 in the y-direction between the two arms 15b and 15d is also provided beneath the heater metal layer 28 of the sensor 20.

The above-described underlap distances Δx and Δy typically have the same dimension, and also the lateral separation gaps 1 and 2 typically have the same dimension, such that a symmetrical geometry exists between the antenna underlapping the detector (sensor) element 20. This results in a square-shaped gap 29 formed in the geometric center of the antenna 15. During use of the focal plane sensor array, incident radiation R, such as mmwave and microwave radiation, is collected by the antenna 15 and is coupled to the dissipative load of the sensor 20 (viz., the heater metal layer element 28 thereof). As a result, the temperature of the thin film resistive material 25 (bolometer) increases causing its resistance to change in a way that can be monitored. The purpose and function of providing the nontouching underlaps beneath the heater metal layer 28 of the sensor 20 between the opposite inner ends 3, 3', and 4, 4' of the respective bowtie microantennas 15' and 15" is as follows. Currents are induced into the arms of the antenna structure 15 as it concentrates the energy of the incident radiation R into electrical currents on the conductive arms 15a, 15b, 15c and 15d that are focused to inner ends 3, 3' and 4, 4' of microantennas 15' and 15", respectively. The trapezoid defined by Δx forms a capacitance in the x-direction, and the trapezoid defined by Δy forms a capacitance in the y-direction.

The intercepted energy at the antenna 15' is coupled in the overlap region Δx into the heater metal film 28 of the mm-wave sensor 20. In the optimum case of this embodiment, the effective series impedance, X, calculated as $X=[(2/\omega C_{overlap})^2 + (R_{NiCr})^2]^{1/2}$, is dominated by the heater metal layer 28. This impedance is selected to match the antenna impedance, typically 50–100 ohms. Similarly, the absorbed energy at the antenna 15" is coupled in the overlap region Δy into the heater metal film 28. The dimensioning of the nontouching underlaps Δx and Δy should be selected such that the electrical field on the bowties (15' or 15") can couple (jump) up to the heater metal layer 28, and then the current couples (jumps) back down from the heater metal layer 28 to the bowtie arm located at the opposite side of the gap. The heater metal layer 28 is a material of low resistivity, such as Ni—Cr, and it can be deposited on either or both outer sides of sensor 20. The heat is transferred from the heater metal layer 28 to the thermoresistive layer 25 of the sensor 28 via dielectric film 27, causing the temperature of the thermoresistive material to change in manner that can be monitored and detected by readout circuitry via contacts 19. By appropriately selecting the resistance of the heater metal layer 28 and the capacitance from the antenna underlap (Δx, Δy), the total impedance of the series capacitance-resistance-capacitance circuit just described is matched to the antenna impedance for efficient coupling. Also, the vertical (z-direction) gap between the heater metal layer 28 of sensor 20 and the antenna 15 determines the overlap capacitance, and this vertical gap is preferably in the range of 0.1 to 1 micrometer. The thickness of the temporary sacrificial layer 16 is controlled to provide an appropriate vertical gap between the antenna 15 and heater metal layer 28.

The antenna design used in the inventive radiation sensor increases the sensitivity of the sensor 20 in that the antenna 15 thereby absorbs electromagnetic radiation of both polarities. For instance, the crossed bowtie configuration enables the capture of radiation with both polarizations. This approach maximizes performance of the passive millimeter wave detector because natural passive radiation is randomly polarized, i.e., has equal components in both polarization directions. Additionally, since efficient thermal detectors, i.e., bolometers, must have low thermal conductance of the order of 1E—7 W/K to their environment, the noncontact feature of this invention eliminates the excess thermal conductance incurred by a direct electrical connection (also referred to as an "ohmic connection)" between the antenna and the thermally isolated thermal detector. The inventive sensor array architecture can be operated uncooled as a passive system, and it displaces mmwave detectors that utilize individual active millimeter integrated circuits MMIC's) to detect mmwave radiation at each pixel.

Although this invention has been illustrated above by way of the preferred embodiment using capacitive coupling of the radiation field to the mm-wave sensor from the antenna. In principle, other coupling schemes also could be used including resistive or inductive coupling schemes. In a resistive coupling scheme, low resistance legs, e.g., a combination of nitride and Ni—Cr, that are lower than the matching impedance, extend over a gap between the antenna and the mm-wave sensor having a construction generally as described above. For an inductive coupling scheme, a current is created in the Ni—Cr heater metal layer of the mm-wave sensor by connecting a loop with an inductor between the two inner ends of the opposing microantenna arms as described above for the capacitive coupling scheme.

The integrated focal plane sensor array devices of this invention are monolithically fabricated on the same side of a semiconductor substrate (e.g., monocrystalline silicon or silicon-on-insulator (SOI)) for implementation simultaneously in the mm-wave (e.g., 3 mm at 94 GHz) and infrared (e.g., 1–14 $\mu$m) bands, where the mm-wave FPA senses both polarizations. The radiation sensors according to this invention have wide applicability, including, for example, security standoff systems, airport security systems, all-weather landing aids, mine detection, missile homing, urban warfare, and so forth.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. An integrated infrared and millimeter-wave monolithic focal plane sensor array comprising:
   a substrate having first and second opposing generally flat surfaces;
   an array of infrared sensors and at least one millimeter-wave sensor provided at a first level on said first surface; and
   a planar antenna for receiving incident millimeter-wave radiation located at a second level located between said first level and said first surface of the substrate, for coupling the millimeter-wave radiation field to the millimeter-wave sensor.

2. The focal plane sensor array according to claim 1 wherein the antenna comprises generally a crossed-bowtie shape.

3. The focal plane sensor array according to claim 2 wherein the crossed bowtie shape comprises first and second bowtie microantennas oriented orthogonally to each other, wherein each microantenna comprises first and second conductive arms separated by a lateral gap between inner ends of the arms, and where the inner ends underlap the millimeter-wave sensor in a manner whereby the antenna capacitively couples an incident radiation field to the millimeter-wave sensor.

4. The focal plane sensor array according to claim 2 where the antenna comprises a generally planar conductive metal film.

5. The focal plane sensor array according to claim 2 where the antenna comprises a generally planar aluminum film.

6. The focal plane sensor array according to claim 1 where the millimeter-wave sensor comprises a sandwich structure constructed of a thermoresistive film sandwiched between two dielectric layers and having a bottom conductive layer.

7. The focal plane sensor array according to claim 6 wherein the thermoresistive film comprises a vanadium oxide.

8. The focal plane sensor array according to claim 6 wherein the conductive layer comprises a metal.

9. The focal plane sensor array according to claim 8 wherein metal comprises nickel-chromium.

10. The focal plane sensor array according to claim 1 where the millimeter-wave sensor comprises a sandwich structure constructed of a thermoresistive film sandwiched between two dielectric layers and having a top conductive layer.

11. The focal plane sensor array according to claim 10 wherein the thermoresistive film comprises a vanadium oxide.

12. The focal plane sensor array according to claim 10 wherein the conductive layer comprises a metal.

13. The focal plane sensor array according to claim 1 where the millimeter-wave sensor comprises a sandwich structure constructed of a thermoresistive film sandwiched between two dielectric layers and having a top conductive layer and a bottom conductive layer.

14. The focal plane sensor array according to claim 13 wherein the thermoresistive film comprises a vanadium oxide.

15. The focal plane sensor array according to claim 13 wherein the conductive layers each comprises a metal.

16. The focal plane sensor array according to claim 1 where the substrate comprises a readout integrated circuit.

17. The focal plane sensor array according to claim 1 wherein said infrared sensors and said millimeter-sensor are bolometers.

18. The focal plane sensor array according to claim 1 where the infrared and millimeter-wave sensors comprise identical sandwich structures constructed of a thermosresistive film sandwiched between two dielectric layers and having at least one conductive layer absorbing the millimeter wave energy and a top layer absorbing the infrared wave energy.

19. An integrated infrared and millimeter-wave monolithic focal plane sensor array comprising:
   a silicon wafer substrate having first and second opposing generally flat surfaces and a read-out integrated circuit,
   an array of infrared sensors and at least one millimeter-wave sensor provided at a first planar level on said first surface, wherein the infrared sensors and millimeter-wave sensor are located above and physically spaced from the first surface of the substrate, and said IR sensors and millimeter-wave sensor each independently comprises (i) a sandwich structure comprising a heater metal film, a first dielectric film, a thermoresistive film, a second dielectric film, in that sequence, and (ii) at least one contact leg extending downward from and connecting the sandwich structure to the substrate; and
   a planar antenna having a generally crossed-bowtie shape for receiving incident millimeter-wave radiation located at a second planar level located between and physically spaced from said first planar level and said first surface of the substrate, for coupling the millimeter-wave radiation field to the millimeter-wave sensor.

20. The focal plane sensor array according to claim 19 wherein the crossed bowtie shape comprises first and second bowtie microantennas oriented orthogonally to each other and out of contact with each other, wherein each microantenna comprises first and second conductive arms separated by a lateral gap between inner ends of the arms, and where the inner ends underlap the millimeter-wave sensor in a manner whereby the antenna capacitively couples an incident radiation field to the millimeter-wave sensor.

21. The focal plane sensor array according to claim 19 where the antenna comprises a generally planar conductive metal film.

22. The focal plane sensor array according to claim 19 where the antenna comprises a generally planar aluminum film.

23. The focal plane sensor array according to claim 19 wherein the thermoresistive film comprises a vanadium oxide.

24. The focal plane sensor array according to claim 19 wherein metal layer comprises nickel-chromium.

25. A method for making a radiation sensor, comprising the steps of:

providing a substrate having first and second opposing surfaces;

forming a generally planar thin film antenna on an insulating layer on the first surface of the substrate;

depositing a temporary sacrificial layer having an upper horizontally-extending surface and side vertically-extending surfaces on the antenna;

forming an array of infrared sensors and at least one millimeter-wave sensor each having a planar sandwich structure and as located above and physically spaced from the antenna due to the intervening sacrificial layer material by sequentially forming, in this order, a heater metal layer, a first dielectric film, a thermoresistive film, and a second dielectric film, on the sacrificial layer;

forming conductive contact legs in contact with the thermoresistive film and continuing along the side surfaces of the sacrificial layer such that the legs extend downward from and connect the sandwich structures of the sensors to the substrate; and selectively removing the sacrificial layer to form an air gap between the antenna and the heater metal film of the millimeter-wave sensor.

26. The method of claim 25 wherein the sacrificial layer comprises a photoresist.

27. The method of claim 25 wherein thermoresistive film is provided as vanadium oxide, the heater metal layer is provided as nickel-chromium, and the antenna is provided as aluminum.

* * * * *

UNITED STATES PATENT AND TRADEMARK OFFICE
CERTIFICATE OF CORRECTION

PATENT NO.   : 6,329,649 B1
DATED        : December 11, 2001
INVENTOR(S)  : Michael D. Jack, Jan Grinberg, Frank A. Dolezal and Ray Balcerak It is certified that error appears in the above-identified patent and that said Letters Patent is hereby corrected as shown below:

<u>Title page,</u>
Item [75], the listing of inventor names is revised as follows:
-- Jan Grinberg, Los Angeles, CA; Michael D. Jack, Goleta, CA;
   Frank A. Dolezal, Reseda, CA; Ray Balcerak, Alexandria, VA. --

Signed and Sealed this

Fourteenth Day of May, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,329,649 B1
DATED : December 11, 2001
INVENTOR(S) : Jan Grinberg et al.

It is certified that error appears in the above-identified patent and that said Letters Patent is hereby corrected as shown below:

Column 1,
Line 4, below the title, insert the following text:
-- RIGHTS OF THE GOVERNMENT
This invention was made with Government support under contract No. DAAB07-97-2-J035 awarded by the Department of the Army. The Government has certain rights in this invention. --

Signed and Sealed this

Tenth Day of August, 2004

JON W. DUDAS
*Acting Director of the United States Patent and Trademark Office*